United States Patent
Bultman et al.

(10) Patent No.: US 8,718,798 B2
(45) Date of Patent: May 6, 2014

(54) GATEWAY MIRRORING OF METERING DATA BETWEEN ZIGBEE NETWORKS

(75) Inventors: Robert Marten Bultman, Louisville, KY (US); Jeff Donald Drake, Louisville, KY (US)

(73) Assignee: General Electric Company, Schenectady, NY (US)

( * ) Notice: Subject to any disclaimer, the term of this patent is extended or adjusted under 35 U.S.C. 154(b) by 223 days.

(21) Appl. No.: 12/942,726

(22) Filed: Nov. 9, 2010

(65) Prior Publication Data
US 2012/0116597 A1 May 10, 2012

(51) Int. Cl.
*G05B 11/01* (2006.01)

(52) U.S. Cl.
USPC ............ 700/22; 700/286; 700/295; 700/296; 700/291

(58) Field of Classification Search
None
See application file for complete search history.

(56) References Cited

U.S. PATENT DOCUMENTS

| | | | | |
|---|---|---|---|---|
| 4,336,462 A * | 6/1982 | Hedges et al. | ............ | 307/35 |
| 6,018,690 A * | 1/2000 | Saito et al. | ............ | 700/295 |
| 6,624,532 B1 * | 9/2003 | Davidow et al. | ............ | 307/39 |
| 6,891,478 B2 * | 5/2005 | Gardner | ............ | 340/635 |
| 7,058,524 B2 * | 6/2006 | Hayes et al. | ............ | 702/62 |
| 7,349,766 B2 * | 3/2008 | Rodgers | ............ | 700/295 |
| 7,373,222 B1 * | 5/2008 | Wright et al. | ............ | 700/295 |
| 7,580,775 B2 * | 8/2009 | Kulyk et al. | ............ | 700/296 |
| 8,024,073 B2 * | 9/2011 | Imes et al. | ............ | 700/276 |
| 8,082,065 B2 * | 12/2011 | Imes et al. | ............ | 700/276 |
| 8,082,068 B2 * | 12/2011 | Rodgers | ............ | 700/291 |
| 8,099,195 B2 * | 1/2012 | Imes et al. | ............ | 700/278 |
| 8,140,414 B2 * | 3/2012 | O'Neil et al. | ............ | 705/34 |
| 8,144,596 B2 * | 3/2012 | Veillette | ............ | 370/238 |
| 8,170,695 B2 * | 5/2012 | Spicer et al. | ............ | 700/22 |
| 8,171,364 B2 * | 5/2012 | Veillette | ............ | 714/748 |
| 8,275,471 B2 * | 9/2012 | Huizenga et al. | ............ | 700/22 |
| 2003/0225483 A1 * | 12/2003 | Santinato et al. | ............ | 700/295 |
| 2004/0148060 A1 * | 7/2004 | Lee | ............ | 700/295 |
| 2005/0055432 A1 * | 3/2005 | Rodgers | ............ | 709/223 |
| 2005/0065742 A1 * | 3/2005 | Rodgers | ............ | 702/62 |
| 2006/0184288 A1 * | 8/2006 | Rodgers | ............ | 700/295 |
| 2008/0177678 A1 * | 7/2008 | Di Martini et al. | ............ | 705/412 |
| 2009/0055032 A1 * | 2/2009 | Rodgers | ............ | 700/295 |
| 2009/0153356 A1 * | 6/2009 | Holt | ............ | 340/870.02 |
| 2009/0243869 A1 * | 10/2009 | Sanderford, Jr. | ............ | 340/657 |
| 2010/0121499 A1 * | 5/2010 | Besore et al. | ............ | 700/295 |
| 2010/0207728 A1 * | 8/2010 | Roscoe et al. | ............ | 340/10.1 |
| 2010/0262313 A1 * | 10/2010 | Chambers et al. | ............ | 700/295 |
| 2010/0305772 A1 * | 12/2010 | Rodgers | ............ | 700/295 |
| 2011/0015802 A1 * | 1/2011 | Imes | ............ | 700/300 |
| 2011/0046798 A1 * | 2/2011 | Imes et al. | ............ | 700/286 |
| 2011/0118890 A1 * | 5/2011 | Parsons | ............ | 700/295 |
| 2011/0145611 A1 * | 6/2011 | Lee | ............ | 713/320 |

(Continued)

*Primary Examiner* — Kavita Padmanabhan
*Assistant Examiner* — Christopher E Everett
(74) *Attorney, Agent, or Firm* — Global Patent Operation; Marc A. Vivenzio

(57) ABSTRACT

A method and system is disclosed that includes a central controller that takes energy data available from a power/energy measuring device, such as a "smart" meter that is located on a primary network and makes that data available to devices over a secondary network. The central controller is a home energy gateway that includes two communication modules, one of which is used to bind a meter as a router or end point on the primary network, and one which is used to form a secondary network here the central controller operates as network coordinator. The central controller also operates as an energy service portal for devices on the secondary network.

12 Claims, 2 Drawing Sheets

(56) References Cited

U.S. PATENT DOCUMENTS

| | | |
|---|---|---|
| 2011/0202189 A1* | 8/2011 | Venkatakrishnan et al. .. 700/286 |
| 2011/0202194 A1* | 8/2011 | Kobraei et al. ............... 700/295 |
| 2011/0202196 A1* | 8/2011 | Venkatakrishnan et al. .. 700/295 |
| 2011/0202198 A1* | 8/2011 | Venkatakrishnan et al. .. 700/296 |
| 2011/0202293 A1* | 8/2011 | Kobraei et al. ................. 702/62 |
| 2011/0202783 A1* | 8/2011 | Venkatakrishnan et al. .. 713/340 |
| 2011/0202910 A1* | 8/2011 | Venkatakrishnan et al. .. 717/171 |
| 2011/0264296 A1* | 10/2011 | Drake et al. ................... 700/296 |
| 2011/0282504 A1* | 11/2011 | Besore et al. ................. 700/291 |
| 2012/0053739 A1* | 3/2012 | Brian et al. .................... 700/287 |
| 2012/0063334 A1* | 3/2012 | Drake ........................... 370/252 |
| 2012/0065797 A1* | 3/2012 | Brian et al. .................... 700/295 |
| 2012/0078547 A1* | 3/2012 | Murdoch ......................... 702/62 |
| 2012/0109395 A1* | 5/2012 | Finch et al. ................... 700/295 |
| 2012/0203391 A1* | 8/2012 | Lee ................................ 700/295 |
| 2012/0215370 A1* | 8/2012 | Seo et al. ...................... 700/296 |

* cited by examiner

GATEWAY MIRRORING OF METERING DATA BETWEEN ZIGBEE NETWORKS

BACKGROUND

This disclosure relates to energy management, and more particularly to energy systems and methods with time of use (TOU) and/or demand response (DR) energy programs. The disclosure finds particular application to utility systems and appliances configured to manage energy loads to consumers through a communicating consumer control device, such as a home energy manager (HEM), programmable communicating thermostat (PCT), appliance controller, or the like.

Demand response (DR) appliances are configured to respond to incoming signals from utilities (e.g., for a load shedding event), and/or user inputs for modifying the operation of the appliance (e.g., for energy savings). Coupled with DR appliances a home energy manager (HEM) or home energy gateway (HEG) of a home network provides feedback to a user regarding the performance of the appliances. For example, a user may be able to monitor and/or modify the appliances' responses as well as get feedback on power consumption. In order to reduce high peak power demand, many utilities have instituted time of use (TOU) metering and rates which include higher rates for energy usage during on-peak times and lower rates for energy usage during off-peak times. As a result, consumers are provided with an incentive to use electricity at off-peak times rather than on-peak times and to reduce overall energy consumption of appliances at all times.

There is a need to provide a system that can automatically operate power consuming devices during off-peak hours in order to reduce consumer's electric bills and also to reduce the load on generating plants during on-peak hours. Active and real time communication of energy costs and consumption of appliances to the consumer will enable informed choices of operating the power consuming functions of the appliance.

Further, to better communicate between appliances of a home and inform the user about energy costs and usage there is a need to get specific inputs from all devices within the home area network (HAN) regarding the amount of power each device is consuming. This disclosure provides a means of acquiring this data to be shared with the user.

SUMMARY

More specifically, this disclosure provides an energy management system that can determine the power consumption of a device within a home network. The system has a home energy gateway that obtains power/energy data available at a smart meter and makes the data available to the appliances on the network. A primary network (e.g., a Zigbee network) includes a smart meter in communication with a utility and the home energy gateway. The power/energy data is available on the primary network by the smart meter, which measures total power/energy consumption for the home. This data is available on the primary network and is mirrored to a secondary network by the home energy gateway for devices operatively bound to the home energy gateway therein.

In one embodiment, the secondary network is formed by the home energy gateway and includes smart devices, such as smart appliances or demand response appliance and the like. The devices each include a device controller and a communications module. The devices are capable of controlling their electrical load, and store information, such as time stamp information, about when the device is powered on and off. The devices thus receive whole home power/energy consumption information from the home energy gateway to approximate and report their energy usage.

In another embodiment, a method for obtaining power consumption data of a particular one energy consuming device among a plurality of energy consuming devices within a secondary home network. The method includes an energy management system comprising a central controller with at least one memory storing executable instructions. A power/energy measuring device forms a primary home network for measuring the total power consumed by the devices. The method comprises obtaining a total power consumption for the plurality of energy consuming devices at the power/energy measuring device in the primary network and obtaining a communication signal having the total power consumption from the power/energy measuring device via a first communication module at the central controller. The central controller transmits the communication signal on the secondary network to the plurality of energy consuming devices via a second communication module

DETAILED DESCRIPTION

Figure 1:
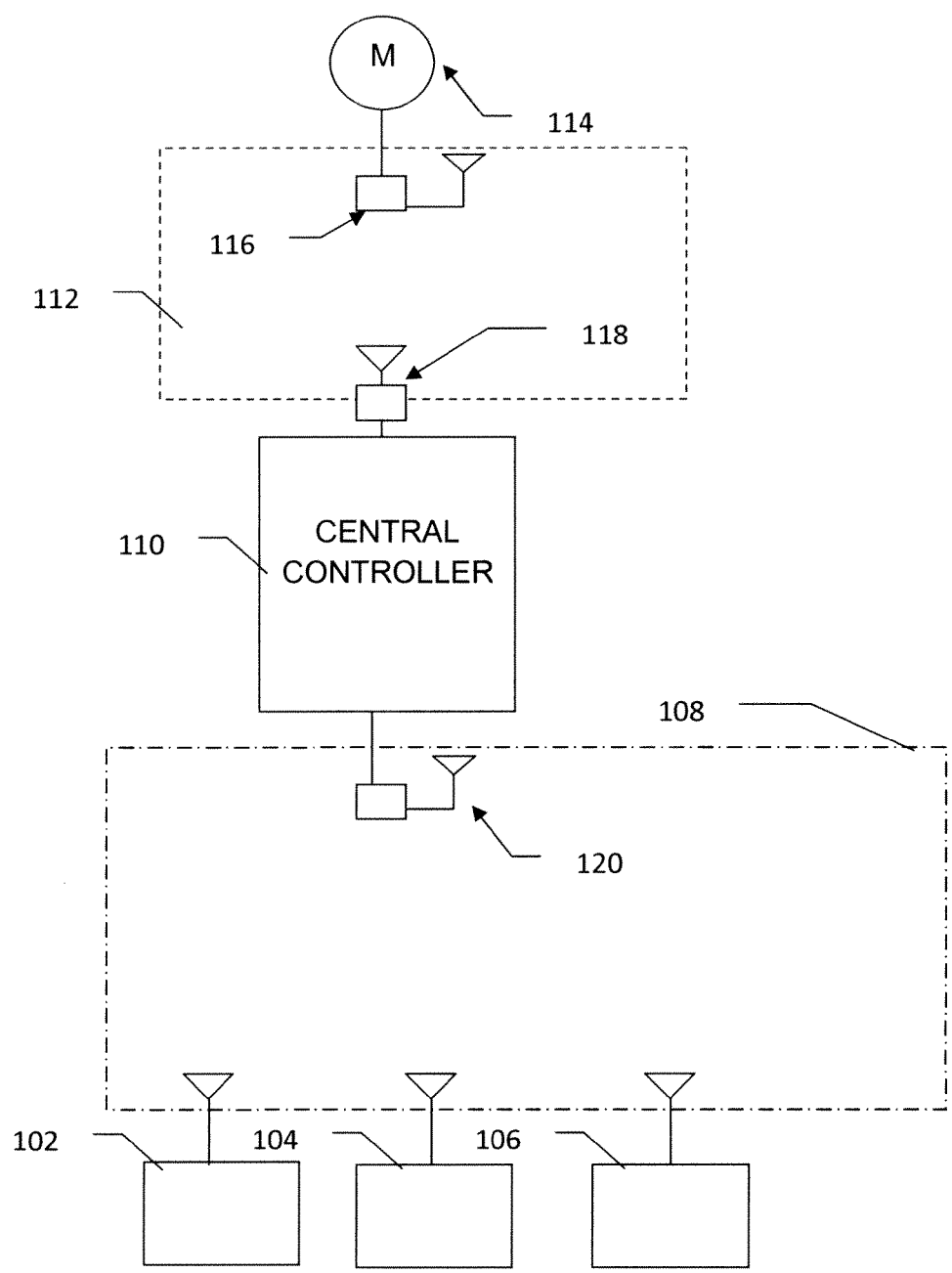
FIG. 1 is a schematic illustration of an energy management system.

FIG. 1 schematically illustrates an exemplary home energy management system 100 for one or more energy consuming devices, such as devices 102, 104, 106 according to one aspect of the present disclosure. Each of the devices 102, 104, 106 can comprise one or more power consuming features/functions. For example, device 102 may be an appliance communication module with a processor or device controller, while device 104 may be a refrigerator, an HVAC system, and/or device 106 may be a pool pump or any energy consuming device capable of having power consumption measured at different times of operation. The devices may also be controllers, or other energy consuming devices other than appliances, such as a programmable communicating thermostat.

The home energy management system 100 comprises a central controller 110 for managing power consumption within a household. The controller 110 is operatively connected to each of the devices 102, 104, and 106 with power consuming features/functions within a primary network 108. The controller 110 can include a micro computer on a printed circuit board, which is programmed to selectively send signals to a device control board (not shown) of device 102, 104, and/or 106 respectively in response to the input signal it receives. For example, DSM signals may be received and communicated to the devices by the device controller, which in turn, is operable to manipulate energizing of the power consuming features/functions thereof. For example, the device controller controls the power consumption by turning the respective device and different features therein on or off, or at a discrete or continuous fraction of the full power.

The central controller 110 is a home energy gateway (HEG), for example, with a memory for processing and storing data, such as time of use (TOU) and/or demand response (DR) program data. The central controller 110 is operable as a gateway device between a utility provider and appliances within the home. For example, the central controller 110 operatively couples a primary network 112 with the secondary network 108.

The primary network 112 includes a meter 114, such as a "smart" electric meter that operates as an energy server interface (ESI) to the central controller 110. The primary network 112 thus provides a link from the meter 114 to the central controller 110, and is the primary or first network of at least two networks within the home. In one embodiment, the primary network 112 is a Zigbee network that communicates data in a Zigbee protocol format to communicating devices within the network, such as the central controller 110. Communication is facilitated by one or more communication modules, such as wireless and/or wired transceivers. For example, a first communication module 116 is operatively coupled to the meter 114 for communicating within the primary network 112 to the central controller 110.

The meter 114 forming an ESI to the primary network 112 also serves as a portal device from utility data center(s) to the networks of the homes, such as the primary network 112 and the secondary network 108. The meter 114 serves as the connection between home area networks and utility networks and provides utility data to the home, such as TOU or DR data. The meter also performs a security function as an interface by letting authorized devices only onto the network, since consumption data is private and utilities do not necessarily want unauthorized devices on the network.

As stated above, homeowners need to make informed decisions regarding their energy consumption use and cost. In general, a homeowner that is informed of energy consumption, such as their electricity usage, will find ways to reduce consumption. Therefore, devices, such as the devices 102, 104, 106 and any number of devices that may be added to the network, can be provided their consumption information through the secondary network 108. For example, the central controller 110 operates as a metering server on a secondary interface for the secondary network 108. The central controller 110 (e.g., an HEG or the like) mirrors information communicated to it from the meter 114. For example, whole-home energy consumption measurements and/or data obtained at the meter 114 are communicated to the central controller 110, which, in turn, are communicated from the controller to devices within the home, such as devices 102, 104, 106 over the secondary network. Each device 102, 104, 106 has a communication module, such as a transceiver or the like, for communicating within the secondary network. Metering data, such as whole-home energy consumption measurement data provided by the meter 114, is mirrored from the central controller 110 to the devices 102, 104, 106. Because the devices are controlled by a device controller, each device is able to process power on and power off states therein. Consequently, each device 102, 104, 106 does not need to be authorized by a utility to join the utility networks or obtain measurement data directly from the meter 114. In addition, each device obtains whole-home energy consumption information and is able to meter its own energy consumption for informing the homeowner.

By knowing whole-home energy consumption information, each device of the home is able to calculate its own energy consumption for consumers to make informed decisions. Because each device 102, 104, 106 knows when power is on and power is off at the device, the energy measurements and information can be calculated by subtraction or other means to obtain consumption information for the particular device. Devices 102, 104, 106 operatively connected to the secondary network 108 are in communication with the home energy gateway, or central controller 110 of the home as well as with one another. The secondary network 108 is therefore able to provide the necessary information for individual devices and/or appliances of the home to make its own calculations. For example, the secondary network may be provided information of what devices are on or off at the time, so that not only does each device know when it is powered on or off, but also has knowledge of when the other devices operatively connected within the network are also powered on or off. This can enable an accurate measurement of each device's energy consumption by subtracting the whole-home energy measurements mirrored from the controller 110 when the particular device is on and off. This real-time information of the energy consumption of the device is then used to report energy usage within the home for informing users of other information also, such as current usage patterns, and/or current power cost that might be presented to the user via a display (not shown) operatively coupled to the device or appliance and/or the central controller 110.

For example, at time 1, a device may be off or inactive state and when expecting to power itself on or to an active state, the device may communicate on the secondary network 108 for metering data. Thus, at time 1, a first energy measurement is obtained by the device. At time 2, the same device follows the same procedure to obtain a second energy measurement. The energy consumption of the device is then able to be computed at the device controller/processor by subtracting or obtaining an absolute difference between the first and the second energy measurements.

The device may obtain metering information for itself at both the off-to on power state change and/or the on-to-off power state change. Regardless, an accurate determination of the device's energy consumption is able to be obtained by the device itself. The device obtains readings of energy consumption from the central controller 110 and makes computations at both power state change times (i.e., when the device powers on and off) as well as keeps a record in a memory (not shown) of the device or other memory of previous computations. In one embodiment, the device may learn its power consumption with additional accuracy as readings are taken and averaged or otherwise calculated in order to account for erroneous readings or measurements during the operation of other devices operatively coupled within the secondary network of the home.

The operation of each device 102, 104, 106 may vary as a function of a characteristic of the utility state and/or supplied energy. Because some energy suppliers offer time-of-day pricing in their tariffs, price points could be tied directly to the tariff structure for the energy supplier. If real time pricing is offered by the energy supplier serving the site, this variance could be utilized to generate savings and reduce load demand. Similarly, if pricing is available for ancillary services, such as providing spinning reserve or frequency regulations, the loads and generation sources in the home may respond in a manner to generate savings for customers.

If the controller 110 receives and processes an energy signal indicative of a peak demand state or high energy price or period at any time during operation of the appliances 102, 104, 106, the controller makes a determination of whether one, more, or all of the power consuming features/functions of each appliance should be operated in the energy savings mode and if so, it signals the appropriate device to begin operating in the energy savings or deferral mode in order to reduce the instantaneous amount of energy being consumed. The controller 110 is configured to communicate with the appliance control board or device controller of the device to provide command instructions for the appliance control board to govern specific features/functions, for example, to operate at a lower consumption level or defer operation and determine what the lower consumption level should be. This enables each appliance to be controlled by the appliance's controller where user inputs are being considered directly, rather than invoking an uncontrolled immediate termination of the operation of specific features/functions of an appliance from an external source, such as a utility. It should be appreciated that the controller 110 can be configured with default settings that govern normal mode and energy savings mode operation. Such settings in each mode can be fixed, while others are adjustable to user preferences to provide response to load shedding signals.

In one embodiment, the central controller 110 operates as a data server embodied in a client application (not shown). The central controller 110 provides data received from devices within the home to the client application, which in turns formats the data to be presented to the user, such as in graphs or other type of displays. The application may be utilized within each device connected to the central controller 110 within the secondary network 108, for example. In another embodiment, the controller 110 operates as a server for serving for providing network data, such as metering information to the devices.

The central controller 110 comprises at least two communication modules, namely a first communication module 118 and a second communication module 120. The second communication module 120 of the central controller 110 communicates to the devices 102, 104, 106. Both the first and second communication modules operate as an interface radio whereby the first communication module 118 facilitates communications to and from the meter 114 with a communication module 116. These interface radios are ZigBee devices for forming at least two Zigbee networks (e.g., the primary and secondary networks) at the home. The central controller 110 can also include ports, such as USB or Ethernet for adding additional functionality. By receiving information gathered at the meter 114 by the central controller 110, the devices operate as if they are communicating with the meter 114 directly. However, the devices are obtaining information indirectly from a server on the secondary network, which communicates information from the central controller 110 via the second communication module 120. Each communication module is a Zigbee device that communicates with a simple metering cluster or Zigbee protocol format.

Figure 2:
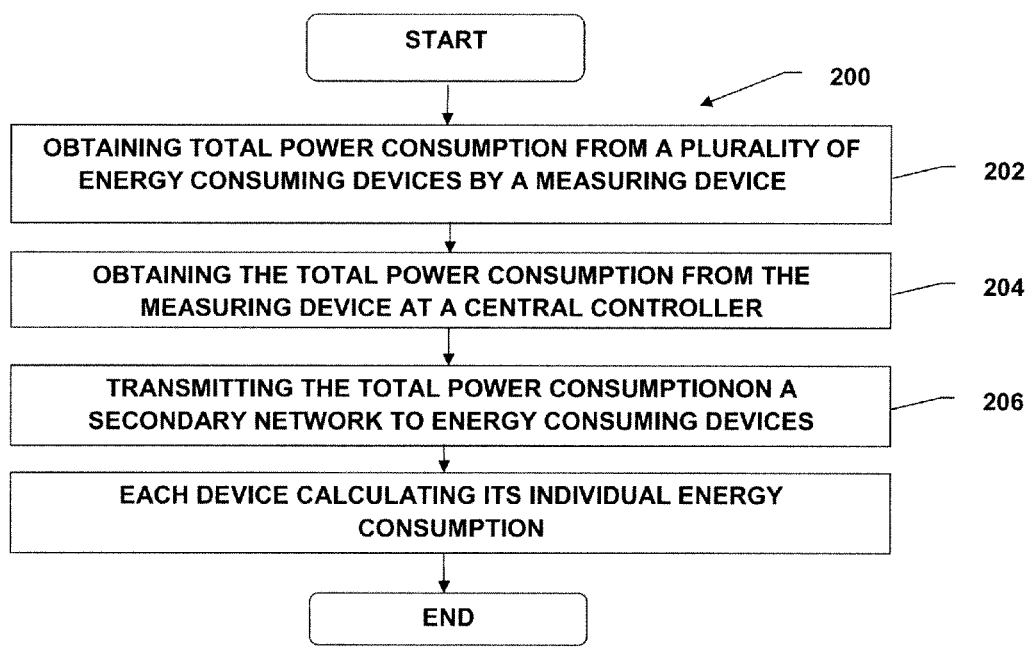
FIG. 2 is a flow diagram illustrating an example methodology for implementing an energy management system with a plurality of energy consuming devices having different components.

Example methodology 200 for obtaining power consumption data of a particular energy consuming device among a plurality of energy consuming devices with a home network is illustrated in FIG. 2. While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Referring now to FIG. 2, is an exemplary method for an energy management and monitoring system of a home. The home includes a central controller 110, such as a home energy gateway, in which energy information is communicated through to the home. The controller is a processor, for example, that links at least two networks at the home, a primary network 112 and a secondary network 108, for example. The controller is coupled to at least one memory storing executable instruction or software and is operatively coupled to a power/energy measuring devices that measures total power consumed at the home.

At 202 a total power consumption is obtained for the energy consuming devices of the home by the power/energy measuring device (e.g., a smart meter). The meter is within a primary network and is configured to be an interface device for a utilities network. The meter includes a communication module, such as a Zigbee transceiver, that communicates whole-home metering data or total energy consumption data of the home to the central controller.

At 204 the central controller includes at least two communication modules, which are Zigbee communication transceivers. A first communication module 120 obtains communication signals having the total consumption data from the meter 114. At 206 the controller transmits the communication data received from the meter to energy consuming devices via a second communication module 118 over a secondary network, which is a metering sever operated by the central controller.

In one embodiment, each energy consuming device is operable to determine its own individual power consumption by calculating a difference in the total power consumption received over the meter server on the secondary network during an active or powered on mode and an inactive or powered down mode, such as in off or standby power modes. Furthermore, addition devices are added to the secondary network and operate to obtain whole-home energy consumption information there from without being authorized to join a utilities network.

The invention has been described with reference to the preferred embodiments. Obviously, modifications and alterations will occur to others upon reading and understanding the preceding detailed description. It is intended that the invention be construed as including all such modifications and alterations.

What is claimed is:

1. An energy management system for a home area network (HAN) having managed energy consuming devices for a home that respectively draw different amounts of power from a source of power, the system comprising:

a primary network comprising a smart energy meter in communication with the managed energy consuming devices, the smart energy meter configured to collectively provide a total power consumption measurement for the home;

a secondary network comprising the managed energy consuming devices, wherein the secondary network is different than the first network; and a central controller in communication with the smart energy meter via the primary network and with the managed energy consuming devices via the secondary network, the central controller comprising:

a first communication module that is in communication with the smart energy meter; and a second communication module that is in communication with the managed energy consuming devices, wherein the first communication module and the second communication module comprise a Zigbee device that communicates with the smart energy meter and the managed energy consuming devices using a Zigbee protocol format, wherein the central controller is configured to mirror data from the first communication module to provide the data to the second communication module, wherein the central controller is configured to monitor and manage energy consumption of each of the managed energy consuming devices b sending communications that incorporate the mirrored data comprising the total power consumption measurement to each of the managed energy consuming devices and to provide real time feedback with respect to energy usage occurring at the home, wherein, in response to receiving the total power consumption measurement, each managed energy consuming device is operable to determine an individual power consumption using an average of differences between the total power consumption measurement for active modes on the managed energy consuming device and for inactive modes on the managed energy consuming device over a time interval comprising at least a first time and a second time at which the managed energy consuming device receives the total power consumption measurement, and wherein each managed energy consuming device is operable to report the individual power consumption for display on a display accessible to an end user.

2. The system of claim 1, wherein the first communication module is operable as a router that is an end point device on a primary network, and wherein the central controller is configured to coordinate the managed energy consuming devices as a server thereto.

3. The system of claim 1, wherein the central controller is configured to store data from the measuring, device.

4. A method for determining power consumption data of an energy consuming device among a plurality of energy consuming devices within a secondary home network, the secondary home network comprising the plurality Of energy consuming devices and a central controller with at least one memory storing executable instructions for said method, the central controller also communicating, with a smart energy meter within a primary home network for measuring total power consumed by the energy consuming device, said method comprising:

obtaining a total power consumption measurement for the plurality of energy consuming devices at the smart energy meter in the primary home network;

obtaining a communication signal having the total power consumption measurement from the smart energy meter via a first communication module at the central controller; and conveying the communication signal on the secondary home network to the plurality of energy consuming devices via a second communication .module, wherein the first communication module and the second communication module comprise a Zigbee device that communicates with the smart energy meter and the plurality of energy consuming devices using a Zigbee protocol format, wherein the central controller is configured to mirror data comprising the total power consumption measurement from the first communication module to provide the data to the second communication module, wherein, in response to receiving the total power consumption measurement, each managed energy consuming device is operable to determine an individual power consumption using an average of differences between the total power consumption measurement for active modes on the managed energy consuming device and for inactive modes on the managed energy consuming device over a time interval comprising at least a first time and a second time at which the managed energy consuming, device receives the total energy consumption measurement, and wherein each managed energy consuming device is operable to report the individual power consumption for display on a display accessible to an end user.

5. The method of claim 4, wherein the plurality of energy consuming devices do not receive data from the primary home network.

6. The method of claim 4, wherein the secondary home network includes the second communication module that communicates from the central controller to the plurality of energy consuming devices.

7. The method of claim 4, wherein the central controller is a home energy gateway device that provides a metering server on the secondary home network for the plurality of energy consuming devices to obtain power consumption information therefrom.

8. The method of claim 4, wherein the central controller stores data from the measuring device as a second metering device that communicates directly with the plurality of energy consuming devices.

9. A system, comprising:

a first communication module communicatively connected to a smart energy meter that obtains a total power consumption measurement for a plurality of energy consuming devices of a home and is an end point device on a primary network;

a second communication module communicatively connected to the plurality of managed energy consuming devices that is configured to form a secondary network; and a central controller operatively connected to the first communication module and the second communication module, wherein the central controller is configured to mirror data comprising the total power consumption measurement from the first communication module to provide the total power consumption measurement to the second communication module, wherein the central controller is configured to receive the total power consumption measurement from the smart energy meter via the first communication module and provide the total power consumption measurement to the plurality of managed energy consuming devices, wherein the first communication module and the second communication module comprise a Zigbee device that communicates with the measuring device and the plurality of managed energy consuming devices using a Zigbee protocol format, and wherein, in response to receiving the total power consumption measurement, each managed energy consuming device is operable to determine an individual power consumption using an average of differences between the total energy consumption measurement for active modes on the managed energy consuming device and for inactive modes on the managed energy consuming device over a time interval comprising at least a first time and a second time at which the managed energy consuming device receives the total energy consumption measurement, and wherein each managed energy consuming device is operable to report the individual power consumption for display on a display accessible to an end user.

10. The home energy gateway device of claim 9, wherein the central controller is configured to coordinate the secondary network by transmitting data for processing to a device at the plurality of energy consumption devices of the home.

11. The home energy gateway device of claim 9, further comprising a user display device operatively connected to the central controller and configured to present the total consumption data stored in a memory.

12. The home energy gateway device of claim 10, wherein the plurality of energy consuming devices comprise at least one demand response appliance configured to manage power consumption by responding to communication commands from a device controller threat, wherein the energy consuming devices comprise a heating, ventilation, and air conditioning (HVAC) device, a refrigerator, a dishwasher, a dryer and any other power consuming device configured to operate at power levels detected by the measuring device.

* * * * *

UNITED STATES PATENT AND TRADEMARK OFFICE
CERTIFICATE OF CORRECTION

| | | |
|---|---|---|
| PATENT NO. | : 8,718,798 B2 | Page 1 of 1 |
| APPLICATION NO. | : 12/942726 | |
| DATED | : May 6, 2014 | |
| INVENTOR(S) | : Bultman et al. | |

It is certified that error appears in the above-identified patent and that said Letters Patent is hereby corrected as shown below:

In the Specification

In Column 6, Line 67, in Claim 1, delete "b" and insert -- by --, therefor.

In Column 7, Line 27, in Claim 3, delete "measuring, device." and insert -- measuring device. --, therefor.

In the Claims

In Column 7, Line 31, in Claim 4, delete "Of" and insert -- of --, therefor.

In Column 7, Line 34, in Claim 4, delete "communicating, with" and insert -- communicating with --, therefor.

In Column 7, Line 47, in Claim 4, delete "communication .module," and insert -- communication module, --, therefor.

In Column 7, Line 65-66, in Claim 4, delete "consuming," and insert -- consuming --, therefor.

Signed and Sealed this
Ninth Day of September, 2014

Michelle K. Lee
*Deputy Director of the United States Patent and Trademark Office*